(12) United States Patent
Zhang et al.

(10) Patent No.: US 7,667,300 B2
(45) Date of Patent: Feb. 23, 2010

(54) SEMICONDUCTOR DEVICE INCLUDING GATE STACK FORMED ON INCLINED SURFACE AND METHOD OF FABRICATING THE SAME

(75) Inventors: Xiaoxin Zhang, Yongin-si (KR); Wenxu Xianyu, Suwon-si (KR); Takashi Noguchi, Yongin-si (KR); Hans S. Cho, Seoul (KR); Huaxiang Yin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 305 days.

(21) Appl. No.: 11/600,741

(22) Filed: Nov. 17, 2006

(65) Prior Publication Data

US 2007/0111605 A1  May 17, 2007

(30) Foreign Application Priority Data

Nov. 17, 2005  (KR) .................. 10-2005-0110122

(51) Int. Cl.
*H01L 29/04* (2006.01)
(52) U.S. Cl. .................. 257/627; 257/628; 257/409; 257/E29.004; 257/E29.136; 257/E29.201

(58) Field of Classification Search .................. 257/627, 257/628, 409, 496, E29.004, E29.136, E29.201
See application file for complete search history.

(56) References Cited

U.S. PATENT DOCUMENTS 6,670,694 B2 * 12/2003 Momose ...................... 257/627
2006/0049430 A1 * 3/2006 Kasai et al. .................. 257/213

OTHER PUBLICATIONS

M. Yang et al. "High Performance CMOS Fabricated o Hybrid Substrate With Different Crystal Orientations". 2003.

* cited by examiner

*Primary Examiner*—Minh-Loan T Tran
(74) *Attorney, Agent, or Firm*—Harness, Dickey & Pierce, P.L.C.

(57) ABSTRACT

A semiconductor device includes a transistor. The transistor includes a substrate having an inclined surface, a first upper surface extending from a lower portion of the inclined surface, and a second upper surface extending from an upper end of the inclined surface. A gate stack structure is formed on the inclined surface and includes a gate electrode. A first impurity region formed on one of the first and second upper surfaces contacts the gate stack structure. A second impurity region formed on the second upper surface contacts the gate stack structure. A channel between the first and second impurity regions is formed along the inclined surface in a crystalline direction.

10 Claims, 5 Drawing Sheets

SEMICONDUCTOR DEVICE INCLUDING GATE STACK FORMED ON INCLINED SURFACE AND METHOD OF FABRICATING THE SAME

PRIORITY STATEMENT

This non-provisional U.S. patent application claims priority under 35 U.S.C. § 119 to Korean Patent Application No. 10-2005-0110122, filed on Nov. 17, 2005, in the Korean Intellectual Property Office (KIPO), the entire contents of which is incorporated herein by reference.

BACKGROUND

Description of the Related Art

Related art methods of fabricating semiconductor devices include fabricating semiconductor devices in a stack device structure on a SOI substrate and/or using channel engineering. Operating speed of related art semiconductor devices may be directly related to elements forming the semiconductor device, for example, carrier mobility in a MOS transistor. Carrier mobility in the MOS transistor may be directly related to a position at which a channel is formed. For example, in an NMOS transistor, the carrier mobility may improve when a channel is formed on a (100) surface of a silicon substrate. On the other hand, in a PMOS transistor, carrier mobility may improve when a channel is formed on a (110) surface of a silicon substrate in a <110> crystalline direction. In at least one related art method of fabricating a CMOS, carrier mobility may be improved by forming the NMOS transistor on a (100) surface of an SOI substrate and the PMOS transistor on a (110) surface of a silicon substrate. However, in this related art method bonding may be difficult and processes may be more complex.

SUMMARY

Example embodiments provide semiconductor devices including a transistor capable of simplifying fabrication processes without needing to bond two substrates. Example embodiments relate to semiconductor devices and methods of fabricating the same. At least one example embodiment provides a semiconductor device including a PMOS transistor and a method of fabricating the same.

According to an example embodiment, a semiconductor device may comprise a transistor. The transistor may include a substrate having an (110) inclined surface, a first upper surface and a second upper surface. The (100) first upper surface may extend from a bottom end of the (110) inclined surface, and (100) the second upper surface may extend from a top end of the (110) inclined surface. The transistor may further include a gate stack structure formed on the inclined surface. The gate stack structure may include a gate electrode, a source region and a drain region. The source region may be formed on at least one of the first and second upper surfaces, and may contact the gate stack structure. The drain region may be formed on a remaining portion of the first and second upper surfaces and contact with the gate stack structure, in which a channel between the source and drain regions may be formed along the inclined surface in a <110> crystalline direction.

In at least some example embodiments, an NMOS transistor may be formed in the first upper surface spaced apart from the PMOS transistor. The substrate may be one selected from the group consisting of a silicon substrate, an SOI substrate and a silicon on sapphire (SOS) substrate. The gate electrode and the channel may be formed within the inclined surface or the gate electrode and the channel may be formed to extend outside of the inclined surface.

At least one other example embodiment provides a method of fabricating a semiconductor device comprising a transistor. In at least this example embodiment, a substrate having an (110) inclined surface in at least one portion and a <110> crystalline direction along the inclined surface may be prepared. A gate stack structure comprising a gate electrode on the inclined surface of the substrate may be formed, and a source region may be formed on at least one of a (100) first upper surface of the substrate starting from a bottom end of the inclined surface, and a (100) second upper surface starting from a top end of the inclined surface. A drain region may be formed on a remaining portion thereof. A channel between the source and drain regions may be formed along the inclined surface in the <110> crystalline direction.

In at least some example embodiments, the substrate may be prepared by preparing a first substrate having the first upper surface, forming an insulating layer pattern at least partially covering the first upper surface on the first upper surface. The insulating layer pattern may form an angle with respect to a portion of the first substrate. A second substrate may be formed on the first upper surface around the insulating layer pattern. The second substrate may have the second upper surface and the inclined surface. The insulating layer pattern may be removed. An NMOS transistor may be disposed in the first upper surface spaced from the PMOS transistor. The insulating layer pattern may be formed with an angle of about 45° with respect to a flat portion of the first substrate. The substrate may be formed of one selected from the group consisting of a silicon substrate, an SOI substrate and an SOS substrate.

In at least some example embodiments, the gate electrode and/or the channel may be formed within the inclined surface or the gate electrode and the channel may be formed to extend at least partially onto the first and second upper surfaces. The second substrate may be formed by growing the first upper surface around the insulating layer pattern using a selective epitaxy process. Conditions of the epitaxy process may be controlled to the inclined surface.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
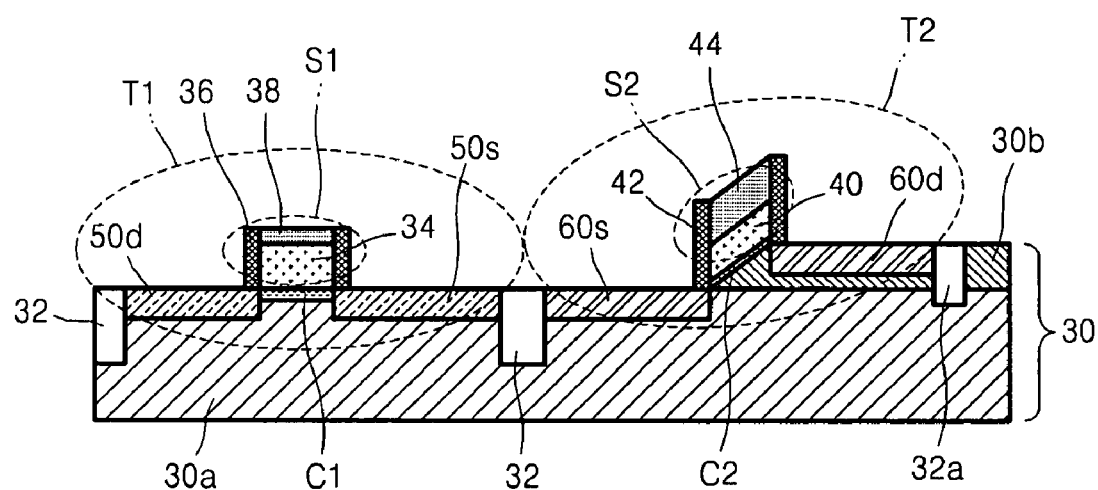
FIG. 1 is a sectional view of a semiconductor device, according to an embodiment example.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

As discussed herein, <110> describes a vector between two lattice points in a crystal structure. Further, (100) and (110) represent surfaces of crystal structures. Because both types of representation (e.g., directional and surface representation) are well-known in the art, further discussion will be omitted for the sake of brevity.

A semiconductor device including a transistor (e.g., a PMOS transistor) and a method of fabricating the same, according to example embodiments, will now be described more fully hereinafter with reference to the accompanying drawings.

Referring to FIG. 1, first and second transistors T1 and T2 may be disposed on and/or in a substrate 30. The substrate 30 may include a first substrate 30a and a second substrate 30b. In at least this example embodiment, the first transistor T1 may be disposed in the first substrate 30a, and the second transistor T2 may be disposed in a portion of the first substrate 30a and in the second substrate 30b. In at least one example, the first transistor T1 may be an NMOS transistor and the second transistor T2 may be a PMOS transistor. However, alternatively, the first transistor T1 may be a PMOS transistor and the second transistor T2 may be a NMOS transistor, or the first and second transistors T1 and T2 may be the same type of transistor.

For simplicity, the substrate 30 may be divided into the first and second substrates 30a and 30b, however, the first and second substrates 30a and 30b may be at least partially different in crystal surfaces and/or directions. In at least one example embodiment, materials of the first and second substrates 30a and 30b may be same. For example, the first substrate 30a may be a silicon substrate, and the first surface on which the first transistor T1 may be formed is (100). The second substrate 30b may be formed by growing or expanding a portion of the first substrate 30a using, for example, a selective epitaxy process. In at least one example embodiment, the second substrate may be a silicon substrate, which is the same or substantially the same as the first substrate 30a. The second substrate 30b may include an inclined surface (e.g., 48 in FIG. 2) on which a channel C2 of the second transistor T2 may be formed. The inclined surface may be surface (110) and channel C2 may be formed along the inclined surface in a <110> crystalline direction. The inclined surface of the second substrate 30b may contact an upper surface of the first substrate 30a (hereinafter, referred to as a first upper surface) and an upper surface of the second substrate 30b (hereinafter, referred to as a second upper surface).

The first and second transistors T1 and T2 of the substrate 30 may be divided by a first isolation layer 32. In at least this example embodiment, the first isolation layer 32 may be a trench-type isolation layer. However, the first isolation layer 32 may be replaced with a bird's beak type or any other suitable layer. The first transistor T1 may be formed in the first substrate 30a between the first isolation layers 32.

The first transistor T1 may include a first gate stack structure S1, source and drain regions 50s and 50d and two isolation layers 32. Each of the source and drain regions 50s and 50d may be disposed between the first gate stack structure S1 and a respective isolation layer 32. The source and drain regions 50s and 50d may be doped with, for example, n-type conductive impurities. However, alternatively, the source and drain regions 50s and 50d may be doped with p-type conductive impurities.

A channel C1 may be disposed below the first gate stack structure S1. The channel C1 may connect the source and drain regions 50s and 50d. The first gate stack structure S1 may include a gate electrode 34 formed on the channel C1, a gate upper insulating layer 38 formed on the gate electrode 34 and/or a gate spacer 36 covering sidewalls of the gate electrode 34.

The second transistor T2 may include a second gate stack structure S2, source and drain regions 60s and 60d; however, the source region 60s may be disposed in the first substrate 30a and contacting the inclined surface of the second substrate 30b. The drain region 60d may be disposed in the second substrate 30b between the inclined surface and a second isolation layer 32a. The second isolation layer 32a may be formed through the second substrate and in the first substrate 30a. A channel C2 may be disposed along the inclined surface in a <110> crystalline direction. The channel C2 may contact the source and drain regions 60s and 60d. The second gate stack structure S2 may be formed on the channel C2. The second gate stack structure S2 may include a gate electrode 40 formed on the channel C2, a gate upper insulating layer 44 formed on the gate electrode 40 and/or a gate spacer 42 covering sidewalls of the gate electrode 40. A gate oxide layer may be disposed between the gate electrode 40 and the inclined surface of the second substrate 30b. However, for the sake of brevity and simplicity, the gate oxide layer is not illustrated in the drawing for convenience. The gate spacer 42 may extend the length of the gate electrode 40 and the gate upper insulating layer 44 in the vertical direction. Although the second gate stack structure S2, in this example embodiment, is formed on the channel C2, the second gate stack structure S2 may be formed such that its side surfaces are disposed perpendicular or substantially perpendicular to the upper surfaces of the first and second substrates 30a and 30b. Further, an upper surface of the gate upper insulating layer 44 may be inclined with an angle equal or substantially equal to that of the inclined surface.

A width of the gate electrode 40 or a length of the channel C2 in the second gate stack structure S2 of the second transistor T2 may be greater than or less than that illustrated in FIG. 1. For example, as illustrated in FIG. 2, the channel C2 of the second transistor T2 may be shorter in length than that illustrated in FIG. 1, or as illustrated in FIG. 3, may be longer than that illustrated in FIG. 1.

Figure 2:
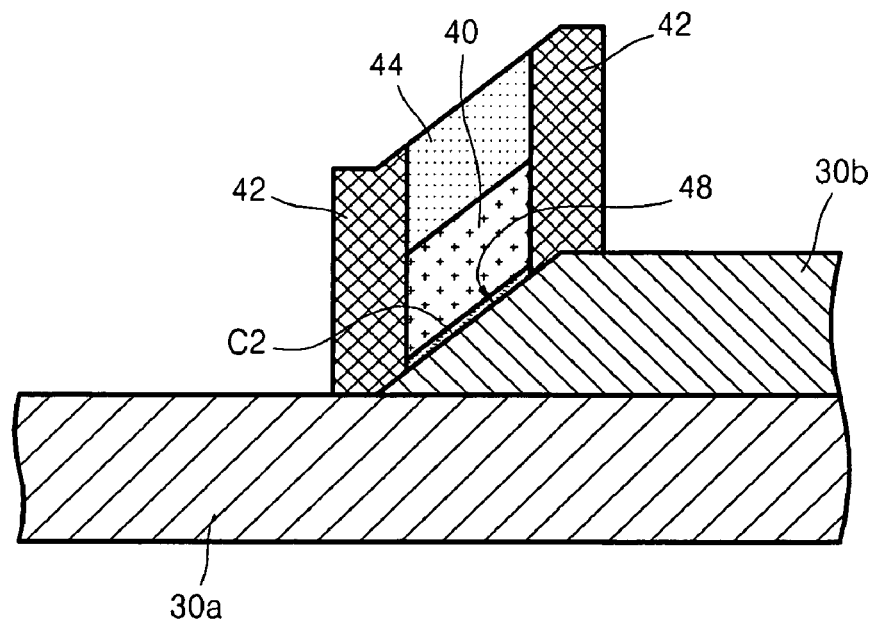
FIG. 2 is an enlarged sectional view illustrating a portion of a transistor in a semiconductor device, according to an example embodiment.
Figure 3:
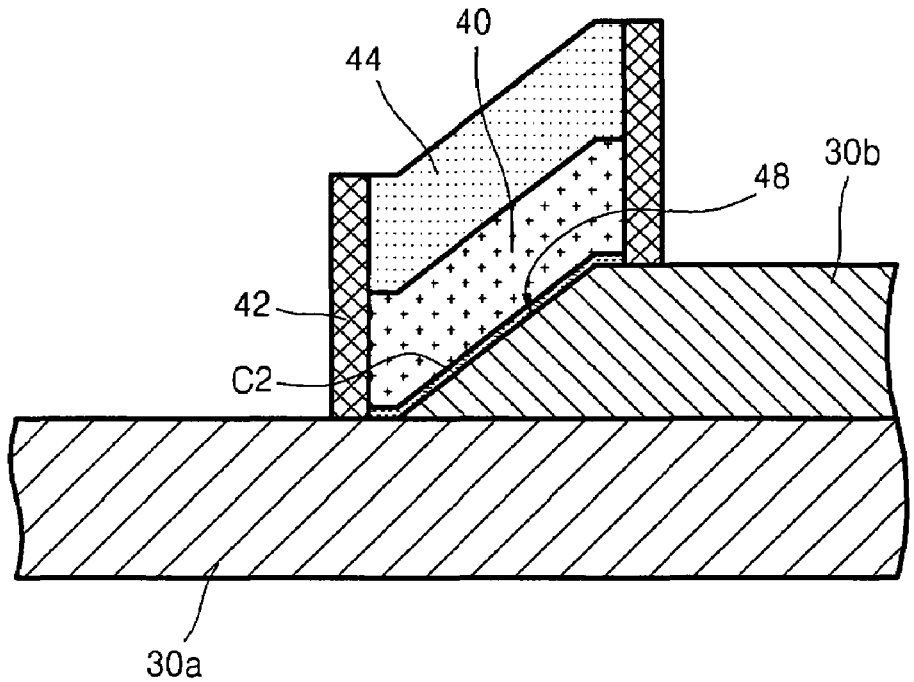
FIG. 3 is an enlarged sectional view illustrating a portion of a transistor in a semiconductor device, according to another example embodiment.

FIG. 2 shows the gate electrode 40 disposed such that the gate electrode 40 does not contact edges of the inclined surface. FIG. 3 shows the gate electrode 40 disposed to extend onto the upper surfaces of the first and second substrates 30a and 30b beyond the inclined surface.

A method of fabricating the semiconductor device, according to an example embodiment will now be described.

Figure 4:
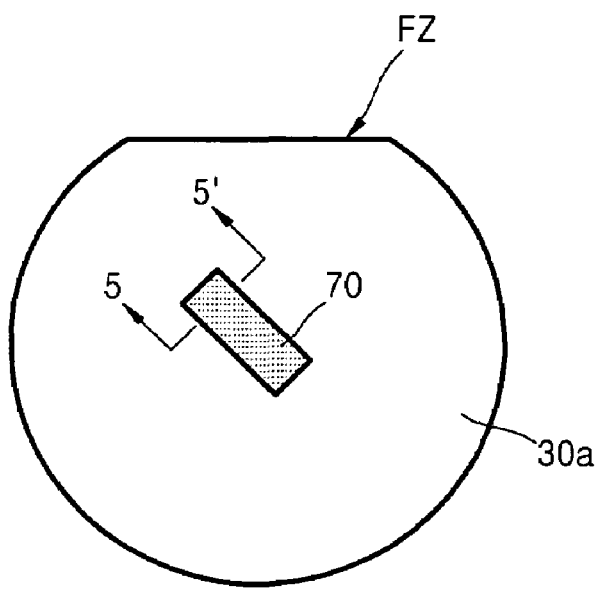
FIGS. 4 through 11 are a plan view and sectional views illustrating a method of fabricating a semiconductor device, according to an example embodiment.

As illustrated in FIG. 4, an insulating layer pattern 70 may be formed on a portion of a first substrate 30a having an upper surface. The first substrate 30a may be a silicon substrate. The insulating layer pattern 70 may be a silicon oxide layer pattern, and may be inclined at angle (e.g., between about 30 to about 60 or about 45) with respect to a flat portion FZ of the first substrate 30a.

Figure 5:
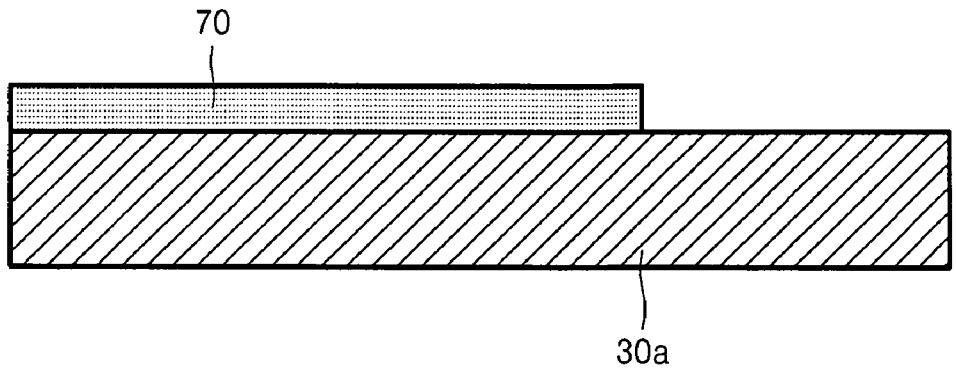

FIG. 5 is a sectional view taken along a direction of 5-5' of FIG. 4. All following drawings are sectional views are based on FIG. 5.

Figure 6:
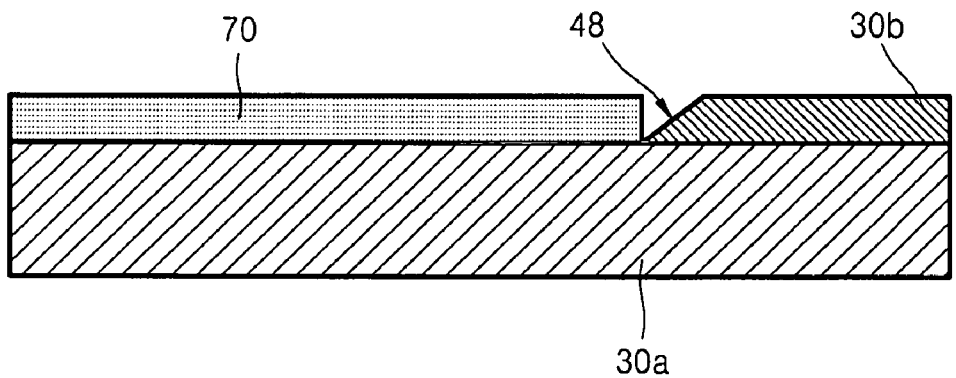

A selective epitaxy process may be performed on the first substrate 30a on which the insulating layer pattern 70 may be formed. The selective epitaxy process may be performed at a temperature between about 650° C. through about 750° C., inclusive. By using the selective epitaxy process, a second substrate 30b may be grown on an exposed portion of the first substrate 30a as shown in FIG. 6. The second substrate 30b may be, for example, a single crystal silicon substrate. However, other types of substrates may be used. The second substrate 30b may be formed to include a (100) upper surface and a (110) inclined surface 48 during the process of growing the second substrate 30b as a result of the presence of the insulating layer pattern 70. The inclined surface 48 may be inclined in a <110> crystalline direction and/or may be formed to face the insulating layer pattern 70.

Figure 7:
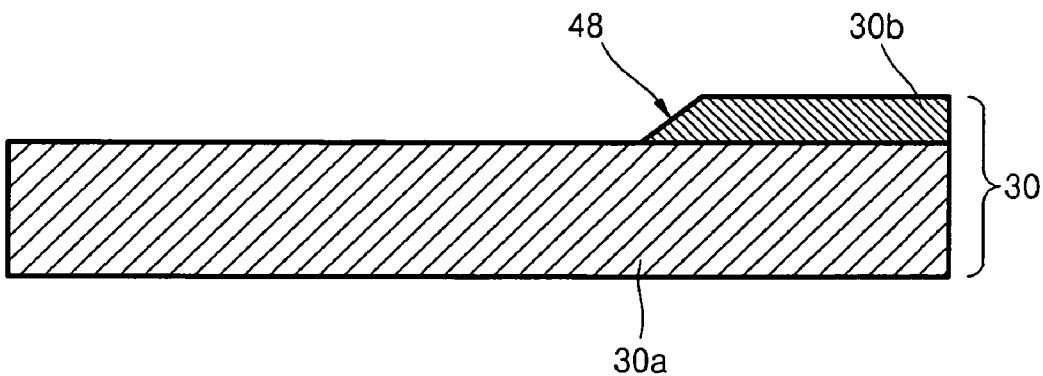

After the second substrate 30b is formed, and if the insulating layer pattern 70 is removed, a substrate 30 including the first and second substrates 30a and 30b may form a stack structure (e.g., the first substrate 30a and the second substrate 30b may be sequentially stacked) as illustrated in FIG. 7.

Figure 8:
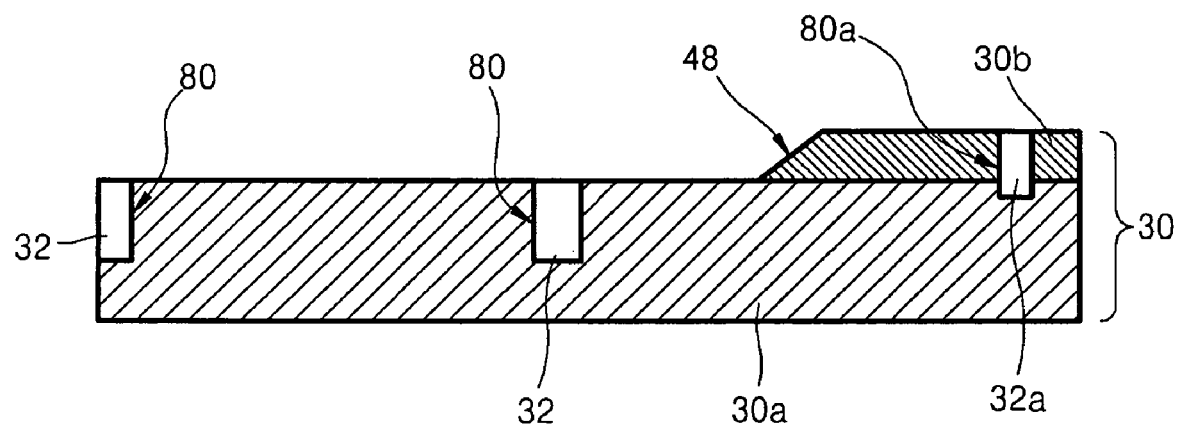

As illustrated in FIG. 8, a first trench 80 may be formed in the first substrate 30a. Two trenches 80 may define an element formation region. A second trench 80a may be formed through the second substrate 30b using the same or substantially the same process. The second trench 80a may be formed to extend into the first substrate 30a through the second substrate 30b. The first trench 80 may be filled with a first isolation layer 32 and the second trench 80a may be filled with a second isolation layer 32a. The first and second isolation layers 32 and 32a may be formed of the same or substantially the same insulating material or material layer, for example, a silicon oxide or any other suitable material or material layer.

Figure 9:
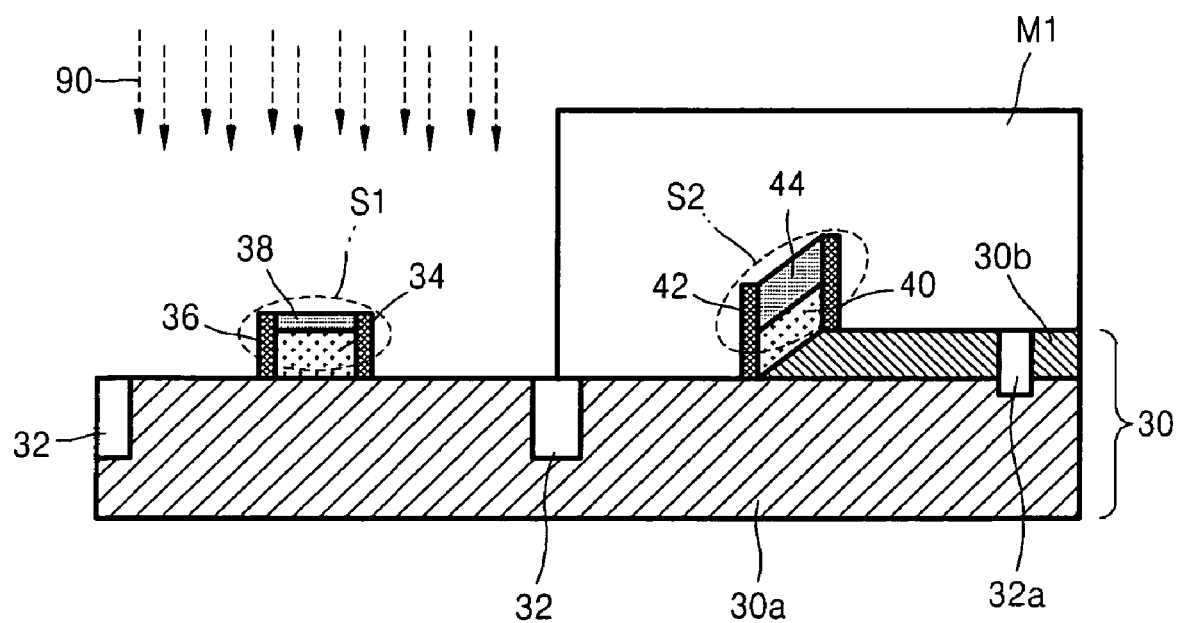

Referring to FIG. 9, a first gate stack structure S1 may be formed on a portion of the first substrate 30a. The portion of the first substrate 30a on which the first gate stack structure S1 is formed may be defined (e.g., confined) by the two isolation layers 32. The first gate stack structure S1 may be formed by stacking (e.g., sequentially stacking) a gate electrode 34 and a gate upper insulating layer 38, patterning the gate electrode 34 and the gate upper insulating layer 38 into a gate line shape and forming a gate spacer 36 on sidewalls of the resultant, patterned structure. A gate insulating layer may be formed between the gate electrode 34 and the first substrate 30a, but is not illustrated for the sake of clarity.

A second gate stack structure S2 may be formed on the inclined surface 48 of the second substrate 30b during (e.g., concurrently) or after forming the first gate stack structure S1 on the first substrate 30a. The second gate stack structure S2 may include a gate electrode 40, a gate upper insulating layer 44 and a gate spacer 42 covering sidewalls of the gate electrode 40 and the gate upper insulating layer 44. The second gate stack structure S2 may be formed using the same or substantially the same processes as discussed above with respect to the first gate stack structure S1. The gate electrode 40, the gate upper insulating layer 44 and the gate spacer 42 of the second gate stack structure S2 may be formed of the same or substantially the same material as discussed above with regard to the gate electrode 34, the gate upper insulating layer 38 and the gate spacer 36 of the first gate stack structure S1, respectively. At least one of the gate electrode 40, the gate upper insulating layer 44 and the gate spacer 42 of the second gate stack structure S2 may be formed concurrently or simultaneously with the forming of the gate electrode 34, the gate upper insulating layer 38 and the gate spacer 36 of the first gate stack structure S1, respectively.

Figure 10:
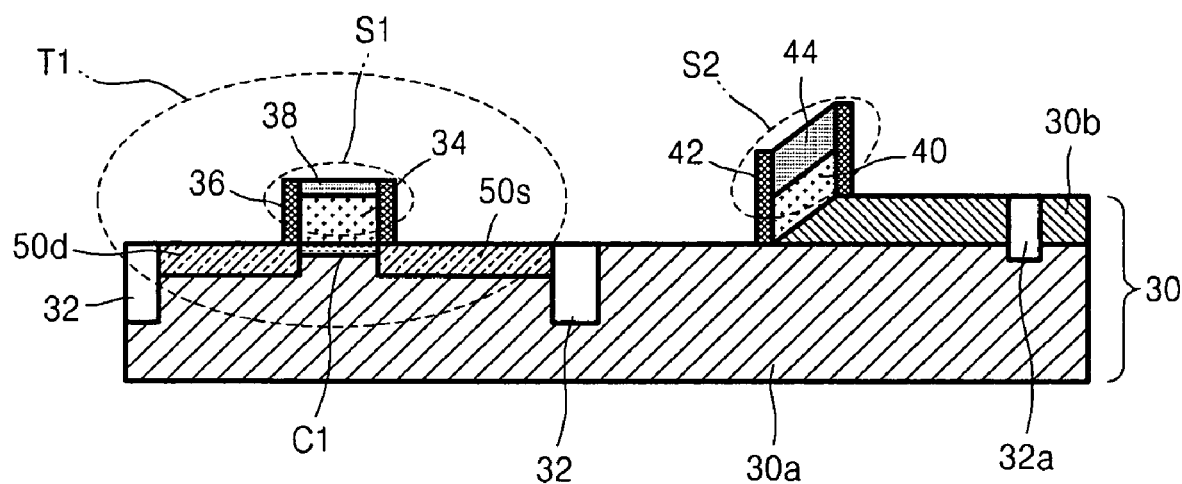

Referring to FIG. 9, after forming the first and second gate stack structures, S1 and S2 in the above-described manner, a portion of the substrate 30 corresponding to the portion where the second transistor T2 of FIG. 1 is formed may be covered with a first mask M1, and the portion of the first substrate 30a on which the first transistor T1 is formed may be exposed. In at least this example, n-type conductive impurities 90 may be implanted on the exposed portion of the first substrate 30a to form source and drain regions. The first mask M1 may be removed, and as illustrated in FIG. 10, a source region 50s may be formed between the first gate stack structure S1 of the first substrate 30a and the first isolation layer 32 adjacent thereto, and a drain region 50d may be formed between the first gate stack structure S1 and another first isolation layer 32 adjacent thereto. Thus, the first transistor T1 (e.g., an NMOS transistor) having a channel C1 in a surface of the first substrate 30a is formed. Alternatively, p-type conductive impurities may be implanted and a PMOS transistor may be formed.

Figure 11:
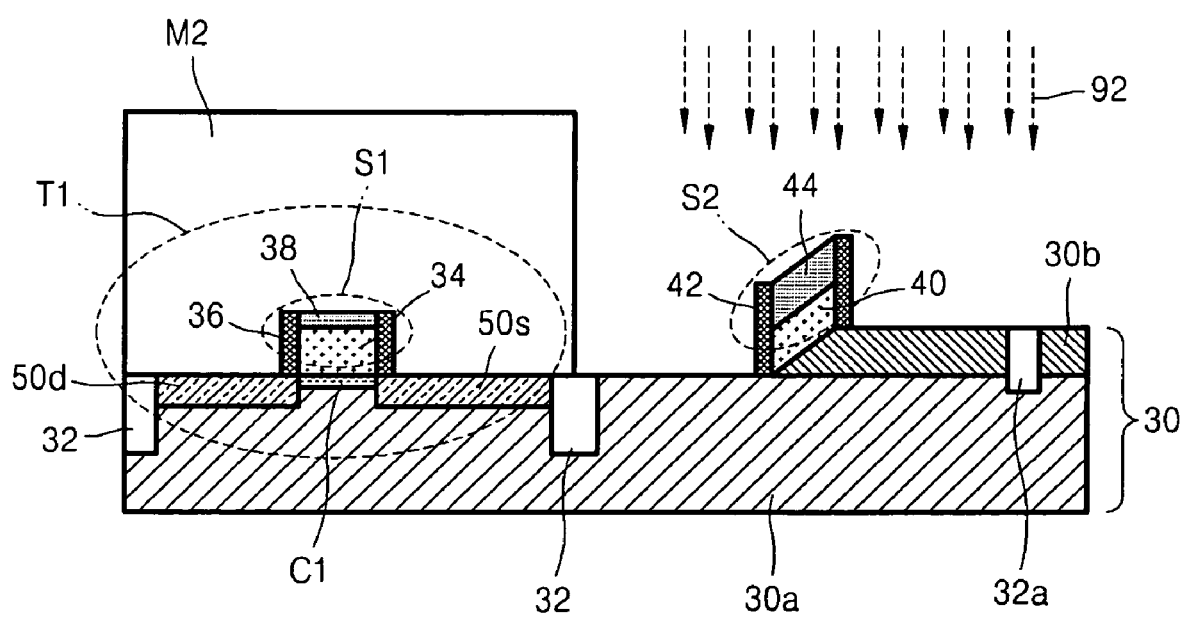

Referring to FIG. 11, a second mask M2 may be formed to cover the first transistor T1 on the first substrate 30a. The second substrate 30b and a portion of the first substrate 30a adjacent to the second substrate 30b may remain exposed. In at least this example, p-type conductive impurities 92 may be implanted on the exposed portion of the first and second substrates 30a and 30b. The second mask M2 may be removed, and as illustrated in FIG. 1, a source region 60s may be formed between the second gate stack structure S2 and the first isolation layer 32, and a drain region 60d may be formed between the second gate stack structure S2 and the second isolation layer 32a. As a result, the second transistor T2 (e.g., a PMOS transistor) having a channel C2 formed along the (110) inclined surface 48 of the second substrate 30b in a <110> direction. Alternatively, n-type conductive impurities may be implanted and an NMOS transistor may be formed. The first and second transistors T1 and T2 formed in the above-discussed manner constitute a CMOS. After the first and second transistors T1 and T2 may be formed as above, a silicide process may be selectively performed only on the source and drain regions 50s, 50d, 60s and/or 60d of the transistors to form a silicide layer (not shown) decreasing an ohmic resistance on surfaces of the source and drain regions 50s, 50d, 60s and/or 60d.

During the process of forming the second transistor T2, the gate electrode 40 of the second gate stack structure S2 may be formed within the inclined surface 48 or may be formed to extend onto upper surfaces of the first and second substrates 30a and 30b beyond the inclined surface 48.

Further, the second substrate 30b may be formed on an SOI substrate or an SOS substrate, and devices according to at least some example embodiments may be formed using, for example, an SOI substrate, an SOS substrate or the like.

Example embodiments may provide a CMOS having improved (e.g., optimized) carrier mobility and/or fabrication processes may be simplified because an NMOS transistor and a PMOS transistor may be formed in a single substrate, a channel of the NMOS transistor may be formed in a (100) surface and a channel of the PMOS transistor may be formed in a (110) surface in a <110> crystalline direction. Further, because various substrates may be employed, application ranges may be widened.

According to example embodiments, production costs may be reduced because carrier mobility of an NMOS transistor and a PMOS transistor may be improved and/or fabrication processes may be simplified. Further, application ranges of example embodiments may be widened because semiconductor device, according to example embodiments, may be formed on various substrates other than a silicon substrate, for example, on an SOI substrate or SOS substrate.

While example embodiments have been particularly shown and described with reference to the drawings, it will be understood by those of ordinary skill in the art that it has been described just as examples rather than confining. For example, the first and second transistors may be stacked vertically. Therefore, it will be also understood by those of ordinary skill in the art that various changes in form and details may be made therein without departing from the spirit and scope as defined by the following claims.

What is claimed is:

1. A semiconductor device comprising:
    a substrate having an inclined surface, a first upper surface and a second upper surface, the first upper surface having a different height than the second upper surface, the inclined surface being inclined relative to the first and second upper surfaces, and the first upper surface being connected to the second upper surface by the inclined surface;
    a gate stack structure formed on the inclined surface;
    a first impurity region formed on the first upper surface, and contacting the gate stack structure; and
    a second impurity region formed on the second upper surface, the second impurity region contacting the gate stack structure and the second impurity region contacting the first impurity region via a channel formed along the inclined surface.

2. The semiconductor device of claim 1, wherein the first upper surface and the second upper surface are in parallel.

3. The semiconductor device of claim 1, wherein the first impurity region is a source region, and the second impurity region is a drain region.

4. The semiconductor device of claim 1, wherein the channel is formed along the inclined surface in a <110> crystalline direction.

5. The semiconductor device of claim 1, wherein the first upper surface extends from a lower portion of the inclined surface, and the second upper surface extends from an upper portion of the inclined surface.

6. The semiconductor device of claim 5, wherein an NMOS transistor is formed in at least one of the first and second upper surfaces.

7. The semiconductor device of claim 6, wherein the substrate is one selected from a group consisting of a silicon substrate, an SOI substrate and an SOS substrate.

8. The semiconductor device of claim 1, wherein the substrate is one selected from a group consisting of a silicon substrate, an SOI substrate and an SOS substrate.

9. The semiconductor device of claim 1, wherein the gate electrode and the channel are formed within the inclined surface.

10. The semiconductor device of claim 1, wherein the gate electrode and the channel extend at least to the edge of the inclined surface.

* * * * *